(12) United States Patent
Vobecky

(10) Patent No.: US 12,495,565 B2
(45) Date of Patent: Dec. 9, 2025

(54) BIDIRECTIONAL THYRISTOR DEVICE WITH ASYMMETRIC CHARACTERISTICS

(71) Applicant: Hitachi Energy Ltd, Zürich (CH)

(72) Inventor: Jan Vobecky, Prague (CZ)

(73) Assignee: HITACHI ENERGY LTD, Zurich (CH)

( * ) Notice: Subject to any disclaimer, the term of this patent is extended or adjusted under 35 U.S.C. 154(b) by 386 days.

(21) Appl. No.: 18/038,643

(22) PCT Filed: Nov. 24, 2021

(86) PCT No.: PCT/EP2021/082811
§ 371 (c)(1),
(2) Date: May 24, 2023

(87) PCT Pub. No.: WO2022/112322
PCT Pub. Date: Jun. 2, 2022

(65) Prior Publication Data
US 2024/0014302 A1    Jan. 11, 2024

(30) Foreign Application Priority Data

Nov. 25, 2020    (EP) ..................................... 20209833

(51) Int. Cl.
*H10D 18/80*    (2025.01)
*H01L 23/552*    (2006.01)
(Continued)

(52) U.S. Cl.
CPC ........... *H10D 18/80* (2025.01); *H01L 23/552* (2013.01); *H10D 62/126* (2025.01); *H10D 62/192* (2025.01); *H10D 64/291* (2025.01)

(58) Field of Classification Search
CPC .... H10D 18/80; H10D 62/192; H10D 64/291; H10D 62/127; H10D 62/141; H10D 84/131
See application file for complete search history.

(56) References Cited

U.S. PATENT DOCUMENTS 5,021,855 A     6/1991  Oikawa et al.
2005/0245006 A1*  11/2005  Tseng ................... H10D 62/126
                                                        257/E29.337
(Continued)

FOREIGN PATENT DOCUMENTS

CN        108063164 A      5/2018
JP       2003-282865 A     10/2003
(Continued)

OTHER PUBLICATIONS

Vobecky et al., "Bidirectional Phase Control Thyristor (BiPCT): A new antiparallel thyristor concept", Published in: 2020 32nd International Symposium on Power Semiconductor Devices and ICs (ISPSD), Sep. 13-18, 2020, DOI: 10.1109/ISPSD46842.2020. 9170072, 4 pages.

*Primary Examiner* — Wasiul Haider
(74) *Attorney, Agent, or Firm* — PROCOPIO, CORY. HARGREAVES & SAVITCH LLP

(57) ABSTRACT

Bidirectional thyristor device comprising a semiconductor body extending in a vertical direction between a first main surface and a second main surface opposite the first main surface, a first main electrode arranged on the first main surface, and a second main electrode arranged on the second main surface, is specified, wherein the semiconductor body comprises a first base layer of a first conductivity type, a second base layer of the first conductivity type, and a third base layer of a second conductivity type different than the first conductivity type arranged between the first base layer and the second base layer. The first main electrode acts as a cathode for a first thyristor functional element and as an anode for a second thyristor functional element of the bidirectional thyristor device. The bidirectional thyristor device is configured asymmetrically with respect to the first (Continued)

thyristor functional element and the second thyristor functional element.

9 Claims, 8 Drawing Sheets

(51) Int. Cl.
    *H10D 62/10*     (2025.01)
    *H10D 62/17*     (2025.01)
    *H10D 64/27*     (2025.01)

(56) References Cited

U.S. PATENT DOCUMENTS

2007/0051972 A1    3/2007   Schulze et al.
2017/0294435 A1   10/2017   Rahimo et al.
2020/0411674 A1*  12/2020   Vobecky .............. H10D 84/131

FOREIGN PATENT DOCUMENTS

JP      2009-218291 A    9/2009
WO    2019/158594 A1   8/2019

* cited by examiner

BIDIRECTIONAL THYRISTOR DEVICE WITH ASYMMETRIC CHARACTERISTICS

CROSS-REFERENCE TO RELATED APPLICATIONS

This application is US National Stage of International Patent Application PCT/EP2021/082811, filed Nov. 24, 2021, which claims priority to European Patent Application No. 20209833.1, filed on Nov. 25, 2020, both of the contents of which are incorporated herein by reference.

A bidirectional thyristor device with asymmetric characteristics is specified.

Various applications require cost efficient antiparallel connected thyristors like the classical Flexible Alternating Current Transmission Systems (FACTS). They are beneficial also for the next generation valve concepts based on voltage source converters (VSC) for high-voltage direct-current (HVDC) transmission generally called Hybrid Multi Modular Converters (MMC).

A bidirectional control thyristor (BCT) may be obtained by two monolithically integrated antiparallel thyristor functions formed by two separated, individually triggered regions on one wafer. However, the process flow is quite complex and the electrical parameters dependent on the device area are halved. For example, the surge current is half of that of a full-wafer device and the thermal resistance of the thyristor is twice as big as that of the single thyristor at the same size wafer.

Document WO 2019/158594 A1 describes a so-called BiPCT concept, where the device has a common p-n-p region for both antiparallel p-n-p-n sections. This concept allows to obtain short commutation turn-off times.

However, many applications require devices with different functionalities that need to be addressed using separate devices at present.

It is therefore an object of the invention to specify a device concept that allows to provide different functionalities.

This object is obtained, inter alia, by a bidirectional thyristor device according to claim 1. Developments and expediencies are subject of the further claims.

According to at least one embodiment the bidirectional thyristor device comprises a semiconductor body extending in a vertical direction between a first main surface and a second main surface opposite the first main surface. A first main electrode is arranged on the first main surface, and a second main electrode is arranged on the second main surface. The semiconductor body comprises a first base layer of a first conductivity type, a second base layer of the first conductivity type, and a third base layer of a second conductivity type different than the first conductivity type arranged between the first base layer and the second base layer. The first main electrode acts as a cathode for a first thyristor functional element and as an anode for a second thyristor functional element of the bidirectional thyristor device, and the bidirectional thyristor device is configured asymmetrically with respect to the first thyristor functional element and the second thyristor functional element.

For example, the first main electrode adjoins at least one first emitter region of the second conductivity type and a plurality of first emitter short regions of the first conductivity type, the second main electrode adjoins at least one second emitter region of the second conductivity type and a plurality of second emitter short regions of the first conductivity type, and an arrangement of the plurality of first emitter short regions at the first main surface differs at least in regions from an arrangement of the plurality of second emitter short regions at the second main surface when seen along the vertical direction, so that the bidirectional thyristor device is configured asymmetrically with respect to the first thyristor functional element and the second thyristor functional element.

For example, the bidirectional thyristor device may provide two antiparallel connected thyristor structures (the first thyristor functional element and the second thyristor functional element) within the same device with an interdigitation of anode and cathode regions to avoid the necessity of separation regions between the two antiparallel thyristors.

Using the asymmetric configuration, at least one characteristic property of the bidirectional thyristor device differs for different polarities of a voltage between the first main electrode and the second main electrode. For example, the first thyristor functional element and the second thyristor functional element differ from one another with respect to at least one of ON state voltage drop, surge current, turn-off time, and technology curve Qrr-VT. For example at least one of these parameters differs between the first and second thyristor functional element by at least 10%. Alternatively or in addition, the first thyristor functional element and the second thyristor functional element may be configured to fulfil different functions.

In other words, the bidirectional thyristor device is intentionally configured such that it behaves asymmetrically with respect to a change of a polarity between a voltage between the first main electrode and the second main electrode.

According to at least one embodiment of the bidirectional thyristor device a local charge carrier recombination lifetime at a p-n junction between the first base layer and the third base layer differs from a local charge carrier recombination lifetime at a p-n junction between the second base layer and the third base layer. Thus, the first thyristor functional element and second thyristor functional element differ from one another with respect to a local value of a charge carrier recombination lifetime close to that p-n junction between the base layers that is closer to the main electrode that acts as a cathode for the respective thyristor functional element. For example, the semiconductor body is configured with respect to the charge carrier recombination lifetime such that the turn-off times of the first and second thyristor functional element differ from one another. It has been found that the lifetime of excess charge carriers in the n-type and p-type base layers may intentionally be reduced by irradiation with electrons, protons or other ions near the p-n junctions in order to ensure that the thyristor is capable of turning off in response to a voltage commutation by an external circuit. For example, a region at a p-n junction between the first base layer and the third base layer is subjected to a larger irradiation dose than a region at a p-n junction between the second base layer and the third base layer or vice versa.

For example, the first thyristor functional element and the second thyristor functional element have different values for the critical $(di/dt)_{crit}$ during voltage commutation. Above this critical value, there is no turn-off during voltage commutation. In this case, the concentration of the electron-hole plasma close to the blocking p-n junction may be so high during crossing the zero-current level that the formation of a space charge region (SCR) is prevented. Thus, the bidirectional thyristor device may remain in the ON state if the polarity of the voltage between the first and second main electrode changes. Thus, a turn-off may only occur, if the bidirectional thyristor device is brought below its holding current.

According to at least one embodiment of the bidirectional thyristor device the first main electrode adjoins at least one first emitter region of the second conductivity type and a plurality of first emitter short regions of the first conductivity type and the second main electrode adjoins at least one second emitter region of the second conductivity type and a plurality of second emitter short regions of the first conductivity type. For example, the first main electrode acts as the cathode for the first thyristor functional element via the first emitter region and as the anode for the second thyristor functional element via the first emitter short regions. Likewise, the second main electrode acts as the cathode for the second thyristor functional element via the second emitter region and as the anode for the first thyristor functional element via the second emitter short regions. In other words, cathode short regions of one thyristor functional element act as anode regions of the antiparallel thyristor functional element at the same time.

According to at least one embodiment of the bidirectional thyristor device an arrangement of the plurality of first emitter short regions at the first main surface differs at least in regions from an arrangement of the plurality of second emitter short regions at the second main surface. For example, a proportion of the first main surface where the arrangement of the first emitter short regions differs from that of the second short regions on the second main surface amounts to between 5% and 100% of the area of the first main surface.

According to at least one embodiment of the bidirectional thyristor device at least one first emitter region overlaps with a second emitter short region when seen along the vertical direction. Using this arrangement, a minimum length of the current paths in the semiconductor body between a first emitter region and the closest second emitter short region may be reduced compared to a fully symmetric arrangement of the emitter short regions on the first and second main surfaces. This may help to minimize the ON state voltage drop of the bidirectional thyristor device.

According to at least one embodiment of the bidirectional thyristor device the first emitter short regions and the second emitter short regions are arranged in an alternating manner at least along one direction in a top view at least in regions. For example, the first emitter short regions and the second emitter short regions are arranged in an alternating manner along two directions in a top view at least in regions. For example, an angle between the two directions is between 45° and 90° inclusive, for instance 60° or 90°.

According to at least one embodiment of the bidirectional thyristor device centers of at least some of the first emitter short regions are arranged beside the plurality of second emitter short regions when seen along the vertical direction. Alternatively or in addition the centers of at least some of the second emitter short regions are arranged beside the first emitter short regions when seen along the vertical direction. For example, at least 2% and at most 100% of the first emitter short regions do not overlap with the closest second emitter short regions when seen along the vertical direction.

According to at least one embodiment of the bidirectional thyristor device at least one of the following criteria (i) and (ii) applies for one of the plurality of first emitter short regions and an associated closest one of the plurality of second emitter short regions when seen along the vertical direction:

(i) a maximum lateral extent of the first emitter short region differs from a maximum lateral extent of the associated closest second emitter short region; and (ii) a center-to-center distance between the first emitter short region and its closest neighbor of the plurality of first emitter short regions differs from a center-to-center distance between the associated closest second emitter short region and its closest neighbor of the plurality second emitter short regions. At least one of the above criteria may also apply to a plurality of or even to all of the first emitter short regions and their associated closest second emitter short regions when seen along the vertical direction. In other words, the arrangement of the first emitter short regions and the arrangement of the second emitter short region may differ from one another at least in regions with respect to at least one of center-to-center distance at the associated main surface and maximum lateral extent. If the short regions have a circular shape, the maximum lateral extent is the diameter. For example, one or more of the first emitter short regions and the associated second emitter short regions differ from one another in at least one of the above parameters by at least 10%. With different values for these parameters, an asymmetric behavior with respect to the ON state voltage VT or the technology curve Qrr-VT may be obtained, where Qrr is the recovery charge.

According to at least one embodiment of the bidirectional thyristor device a proportion of an area of the first main surface formed by the first emitter short regions differs from a proportion of an area of the second main surface formed by the second emitter short regions. For example, the proportion at the first main surface is by a factor of at least 1.5 or 2 or 5 larger than the proportion at the second main surface or vice versa. Alternatively, the proportions may differ by at least 5 percentage points or at least 10 percentage points or at least 20 percentage points and/or at most 50 percentage points.

According to at least one embodiment of the bidirectional thyristor device the first thyristor functional element and the second functional element are configured to have different electrical ratings. For example, the first and second thyristor functional element differ from one another with respect to the rating for at least one of: ON state voltage drop, surge current, and turn-off time. Thus, two thyristor functional elements with different electrical ratings may be integrated in a common device with a single semiconductor body. This may help to reduce the costs and/or to obtain a smaller footprint. For example, one of the first and second thyristor functional elements may fail at low surge currents in order to act as crowbar, whereas the other one acts as a bypass that is capable of withstanding high surge currents.

According to at least one embodiment the bidirectional thyristor device comprises at least one gate electrode. For example, the bidirectional thyristor device comprises at least one of a first gate electrode on the first main surface and a second gate electrode on the second main surface.

According to at least one embodiment the bidirectional thyristor device comprises a first gate electrode on the first main surface, wherein the first main electrode comprises a plurality of first segments that are spaced apart from one another, wherein at least some of the first segments are completely surrounded by the first gate electrode when seen along the vertical direction. For example, each of the first segments of the first main electrode adjoins at least one first emitter region of the second conductivity type and at least one first emitter short region of the first conductivity type.

The first gate electrode surrounding segments of the first main electrode allows to obtain a thyristor functional element that turns on very fast. For example, the first gate electrode may be distributed over the whole first main surface. Thus, the length of the gate-cathode boundary may increase, resulting in an enhanced di/dt capability for fast turn-on. At the same time the dV/dt capability may remain unchanged.

According to at least one embodiment of the bidirectional thyristor device the second main electrode comprises a plurality of second segments that are spaced apart from one another, wherein at least some of the second segments are completely surrounded by the second gate electrode when seen along the vertical direction. The second gate electrode surrounding segments of the first main electrode allows to obtain a bidirectional thyristor device that turns on very fast in both current directions. For example, the second gate electrode may be distributed over the whole second main surface.

Thus, in addition to an interdigitation of anode and cathode of two in antiparallel connected thyristor structures (the first thyristor functional element and the second thyristor functional element) an interdigitation of gate regions may be obtained for at least one of the first and second thyristor functional element. Thus interdigitated gate regions may be provided on at least one of the first and second main surfaces.

According to at least one embodiment of the bidirectional thyristor device a gate electrode in the form of a first gate electrode or a second gate electrode is provided on only one of the first main surface and the second main surface. Thus, one of the thyristor functional elements cannot be triggered directly via a current pulse applied to an associated gate.

Alternatively, both the first and the second gate electrode may be provided. In this case the bidirectional thyristor device may electrically triggered in both current directions via the first and second gate electrode.

According to at least one embodiment of the bidirectional thyristor device one of the first thyristor functional element and the second functional element is configured as a protection device against cosmic rays failure or external faults causing an overload during operation. Thus, the bidirectional thyristor device provides an integrated protection device functionality via one of the thyristor functional elements. For example, one of the thyristor functional elements is configured to be turned on very fast via a gate electrode like a standard phase control thyristor whereas the thyristor functional element connected in antiparallel is used only to provide a turn-on capability in the forward blocking regime. The turn-on may be triggered by a single event caused by cosmic rays, for instance. It has been found that cosmic rays may trigger a thyristor in the forward blocking regime into the ON state without damage. This is also referred to as protective firing. As the first and second thyristor functional element are electrically connected in antiparallel, one of them is in the forward blocking regime irrespective of the polarity of the applied voltage. Thus, the risk of a single event burnout which could happen under reverse blocking in a conventional device may be eliminated or at least significantly reduced. An additional external protection device connected in antiparallel may be dispensed with. As the requirements on the thyristor functional element acting as protection device are reduced, for instance with respect to the VT-Qrr technology curve, the structural parameters of the bidirectional thyristor device may be optimized for the other one of the thyristor functional elements.

According to at least one embodiment of the bidirectional thyristor device both the first thyristor functional element and the second thyristor functional element use an entire area of a p-n junction formed between the first base layer and the third base layer. For example, each the first thyristor functional element and the second thyristor functional element taken individually uses an entire area a p-n junction formed between the second base layer and the third base layer. If, for example, the first conductivity type is p-type and the second conductivity type is n-type, the first thyristor functional element and the second thyristor functional element may use a common p-n-p base layer sequence. A separation region between two antiparallel thyristors may be dispensed with. The first, second and third base layer may be completely unstructured in lateral direction, i.e. in a direction extending in parallel to the first main surface. Furthermore, it is not necessary to provide two separate electrodes on the same side of the bidirectional thyristor device wherein one of them acts as an anode for one thyristor and the other one acts as cathode for the other thyristor.

According to at least one embodiment of the bidirectional thyristor device the first gate electrode forms an ohmic contact with the first base layer. This means, for instance, that there is no p-n junction between the first gate electrode and the first base layer. Alternatively or in addition, the second gate electrode may form an ohmic contact with the second base layer.

According to at least one embodiment of the bidirectional thyristor device the first gate electrode comprises a first grid structure with a plurality of first cells. The first cells may have a polygonal shape in a view onto the first main surface. For instance the first cells may have the shape of a hexagon, an octagon or a tetragon. For instance the bidirectional thyristor device comprises between 20 and 2000 first cells inclusive. The number of cells may be varied in wide ranges depending on the specific requirements on the bidirectional thyristor device. For example, the first grid structure forms a honeycomb pattern at least in regions. For instance the honeycomb pattern is formed by regular hexagons.

According to at least one embodiment of the bidirectional thyristor device a plurality of first emitter short regions is arranged within one of the first cells. For example the number of first emitter short regions within one of the first cells amounts to between 2 and 100 inclusive. However, only one first emitter short region may also be sufficient.

The second gate electrode may comprise a second grid structure with a plurality of second cells. Features described in connection with the first gate electrode may also apply for the second gate electrode.

According to at least one embodiment of the bidirectional thyristor device, an amplifying gate structure is integrated into at least one of the first gate electrode and the second gate electrode. The amplifying gate structure helps to obtain short turn-on times by a fast lateral distribution of the trigger current over a large wafer area. By using an amplifying gate structure both for the first gate electrode and the second electrode short turn-on times may be obtained in both current directions.

According to at least one embodiment of the bidirectional thyristor device the first gate electrode and the second gate electrode have the same base shape. In other words the second gate electrode represents a copy or at least a similar copy of the first gate electrode. Alternatively, the structures of the first and second gate electrode may also differ from one another.

In the exemplary embodiments and figures similar or similarly acting constituent parts are provided with the same reference signs. Generally, only the differences with respect to the individual embodiments are described. Unless specified otherwise, the description of a part or aspect in one embodiment applies to a corresponding part or aspect in another embodiment as well.

The elements illustrated in the figures and their size relationships among one another are not necessarily true to scale. Rather, individual elements or layer thicknesses may be represented with an exaggerated size for the sake of better representability and/or for the sake of better understanding.

Figure 1A:
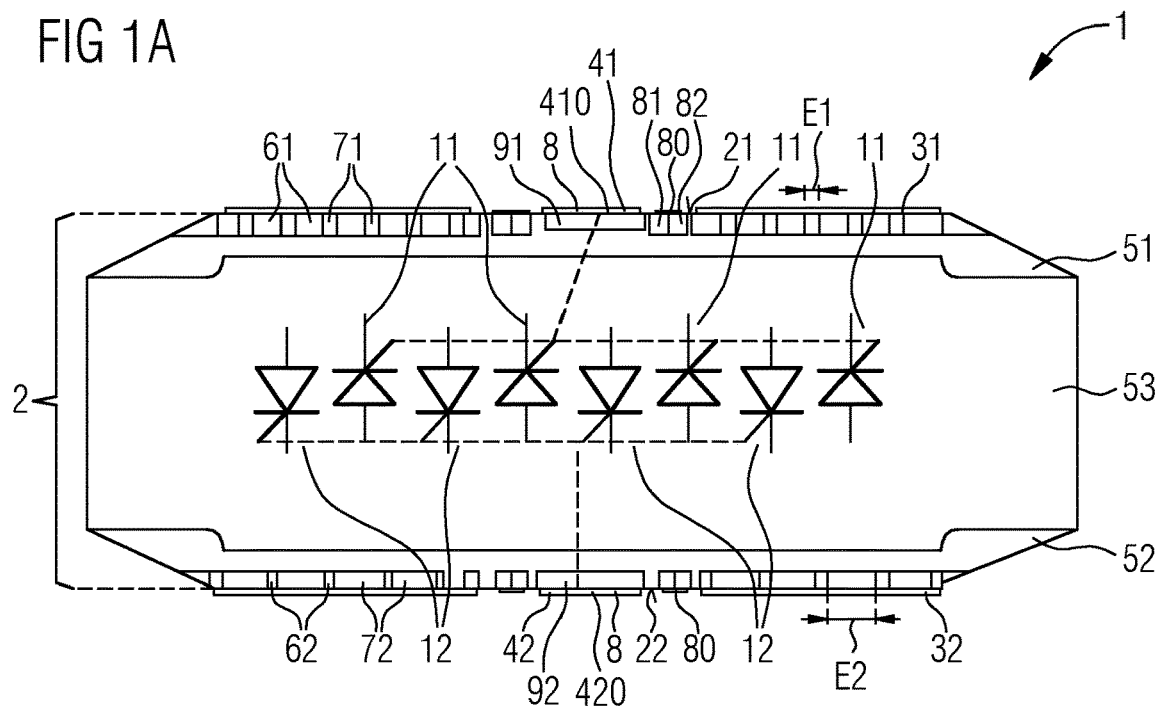
FIGS. 1A to 1C show an exemplary embodiment of the bidirectional thyristor device in a cross-sectional view (FIG. 1A), in a view onto a first main surface (FIG. 1B), and in a view onto a second main surface (FIG. 1C)
Figure 1B:
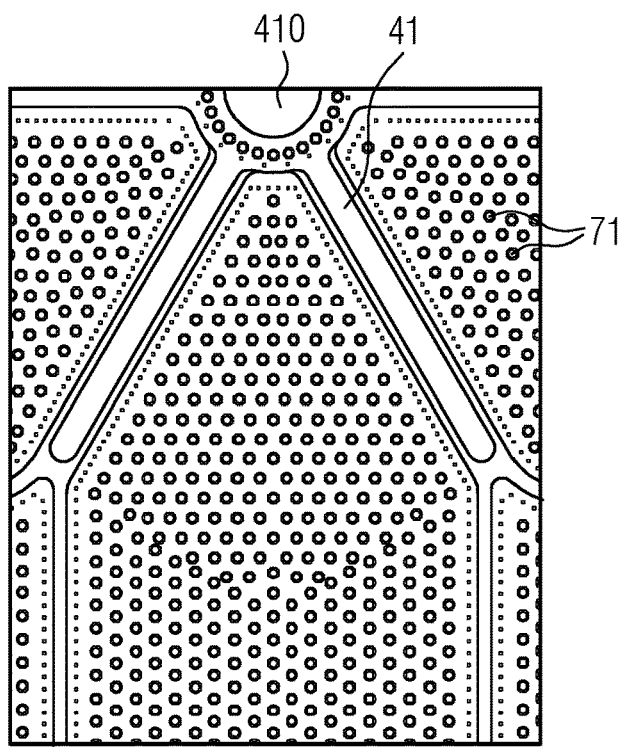
Figure 1C:
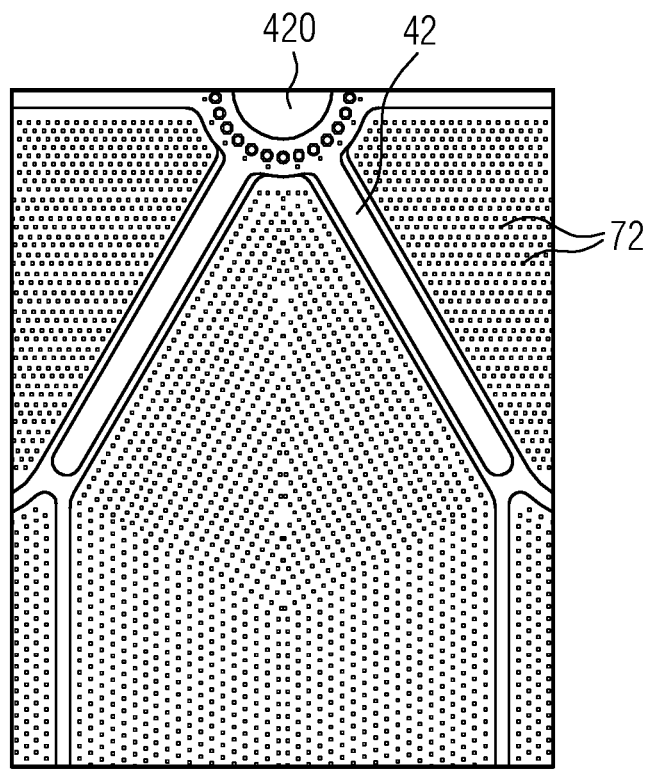

FIGS. 1A, 1B and 1C illustrates an exemplary embodiment of a bidirectional thyristor device 1. The bidirectional thyristor device 1 comprises a semiconductor body 2 extending between a first main surface 21 and a second main surface 22.

The semiconductor body 2 comprises a first base layer 51 of a first conductivity type, a second base layer 52 of the first conductivity type and a third base layer 53 of a second conductivity type different than the first conductivity type arranged between the first base layer 51 and the second base layer 52 in vertical direction. A first main electrode 31 is arranged on the first main surface 21 and a second main electrode 32 is arranged on the second main surface 22. For instance, the first conductivity type is p-type and the second conductivity type is n-type or vice versa.

The first main electrode 31 acts as a cathode for a first thyristor functional element 11 and as an anode for a second thyristor functional element 12. For the second thyristor functional element 12 the first main electrode 31 acts as an anode via the first emitter short region 71. The first thyristor functional element 11 and the second thyristor functional element 12 are illustrated in FIG. 1A using four thyristor symbols for each thyristor functional element, wherein the thyristor symbols belonging to one functional thyristor element are connected electrically in parallel. The first thyristor functional element 11 and the second thyristor functional element 12 represent two thyristor structures connected in antiparallel and arranged within the same semiconductor body 2.

The bidirectional thyristor device 1 is configured asymmetrically with respect to the first thyristor functional element 11 and the second thyristor functional element 12.

The first main electrode 31 adjoins at least one first emitter region 61 of the second conductivity type and a plurality of first emitter short regions 71 of the first conductivity type.

The second main electrode 32 adjoins at least one second emitter region 62 of the second conductivity type and at a plurality of second emitter short region 72 of the first conductivity type. The first thyristor functional element 11 is formed in this embodiment by the second emitter short region 72 acting as an anode, the second base layer 52, the third base layer 53, the first base layer 51 and the first emitter region 61.

Accordingly, the second thyristor functional element 12 is formed by the first emitter short region 71 acting as an anode, the first base layer 51, the third base layer 53, the second base layer 52 and the second emitter region 62. Consequently, the emitter short regions 71, 72 also fulfil the function of an anode for the associated antiparallel thyristor functional element.

Between the first base layer 51 and the third base layer 53 as well as between the third base layer 53 and the second base layer 52 p-n junctions extending over the entire area of the semiconductor body 2 are formed. Both the first thyristor functional element 11 and the second thyristor functional element 12 may thus use the entire area of these p-n junctions. A high surge current capability close to that of a single thyristor of the same size may be obtained in this manner.

The semiconductor body 2 comprises silicon, for example. However, other semiconductor materials may also be used, for instance SiC (silicon carbide).

The bidirectional thyristor device 1 further comprises a first gate electrode 41 on the first main surface 21 and a second gate electrode 42 on the second main surface 22. A bidirectional thyristor device 1 having two gate electrodes may be turned on with respect to both current directions.

However, one of the first and second gate electrodes 41, 42 may also be dispensed with.

The first gate electrode 41 forms an ohmic contact with the first base layer 51 via a first gate contact region 91 of the semiconductor body 2 adjoining the first main surface 21. The second gate electrode 42 forms an ohmic contact with the second base layer 52 via a second gate contact region 92 of the semiconductor body 2 adjoining the second main surface 22. The first gate contact region 91 and the second gate contact region 92 are of the same conductivity type as the first base layer 51.

In the exemplary embodiment shown an amplifying gate structure 8 is integrated into the first gate electrode 41 and the second gate electrode 42. The amplifying gate structure 8 comprises a section 80 of the first gate electrode 41. For example, the section 80 is formed as a ring extending around a first gate electrode pad 410. The first gate electrode pad 410 is configured as an external contact for the application of an external trigger current to the first gate electrode 41. The section 80 overlaps with a first partial region 81 of the first conductivity type and a second partial region 82 of the second conductivity type. This results in an amplification of current pulses applied to the first gate electrode 41 via the first gate electrode pad 410. In principle, this is a Darlington configuration of two bipolar transistors integrated within a thyristor body.

Likewise, the second gate electrode 42 has an amplifying gate structure 8 with a section 80 extending around the second gate electrode pad 420.

In the exemplary embodiment shown the bidirectional thyristor device 1 is formed asymmetrically by means of different configurations for the first emitter short regions 71 and the second emitter short regions 72. Exemplarily the second emitter short regions 72 are larger than the first emitter short regions 71. The first emitter short region 71 and the second emitter short regions 72 may differ from one another over the entire area of the bidirectional thyristor device 1 or only in one or more partial regions, for example near the first and second gate electrodes 41, 42.

For example, a maximum lateral extent E2 of the second emitter short regions 72 is by at least 10% or at least 20% or at least 50% or at least by a factor of 2 larger than a maximum lateral extent E1 of the first emitter short regions.

A proportion of an area of the first main surface 21 covered by the first emitter short region 71 is thus smaller than a proportion of an area of the second main surface 22 covered by the second emitter short region 72. For example, the proportion is by a factor of at least 1.5 or at least 2 or at least 5 larger on one of the main surfaces than on the other one. Alternatively or in addition, the proportions may differ by at least 5 percentage points or at least 10 percentage points or at least 20 percentage points and/or at most 50 percentage points.

Figure 4A:
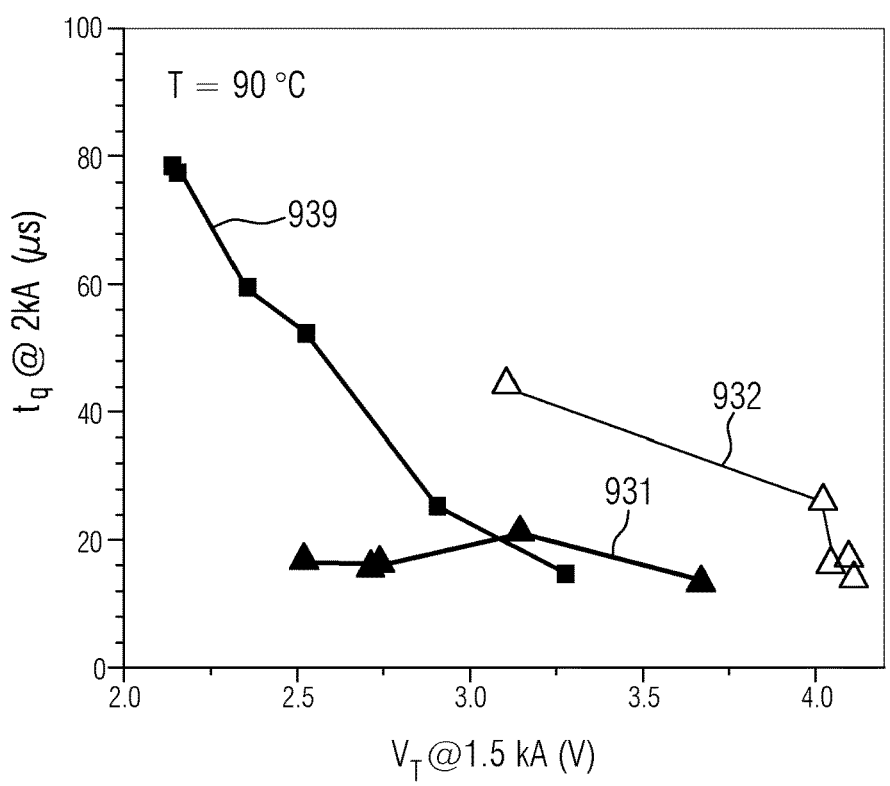
FIGS. 4A and 4B show measurement results of the turn-off time tq at a current of 2 kA as a function of the ON state voltage VT at a current of 1.5 kA for samples with different proportions of the main surfaces covered by the emitter short regions and different irradiation doses.
Figure 4B:
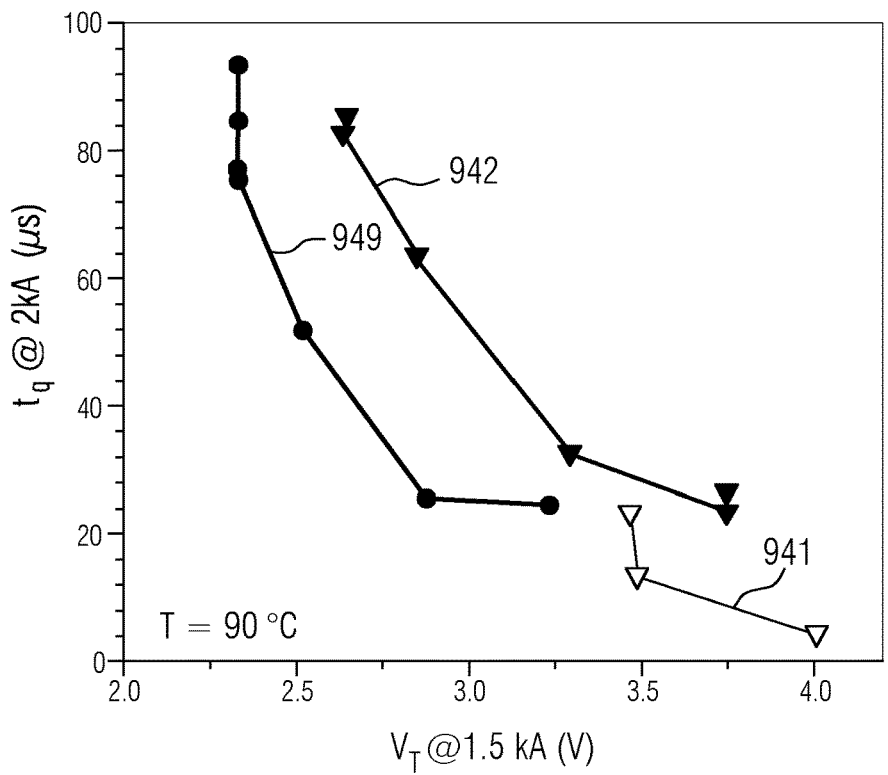

The impact of the proportion of the first and second emitter short regions 71, 72 on the turn-off time is illustrated in FIGS. 4A and 4B. For curve 931 the coverage at the cathode side amounts to 5% and the coverage at the anode side amounts to 30%. For curve 932 the coverage for the cathode side amounts to 30% and at the anode side to 5%. For comparison curve 939 shows the case where the coverage is 30% on both the cathode side and the anode side.

The measurement points on the respective curves represent samples with different proton irradiation doses. As shown in FIG. 4A very short turn-off times tq may be obtained regardless of the proton irradiation dose if the difference between the coverage of the short regions on the cathode side and the anode side is comparably large.

FIG. 4B illustrates that this is not the case if the coverage and the difference between the coverages is smaller. Curve 941 represents a coverage of 5% at the cathode side and 17% at the anode side whereas curve 942 belongs to samples with a coverage of 17% at the cathode side and 5% at the anode side. For comparison curve 949 corresponds to a coverage of 17% on both the cathode side and the anode side.

Consequently different turn-off times may be obtained for the first thyristor functional element 11 and the second thyristor functional 12 element using an asymmetric configuration of the first emitter short regions 71 on the first main surface and the second emitter short regions 72 on the second main surface.

Figure 4C:
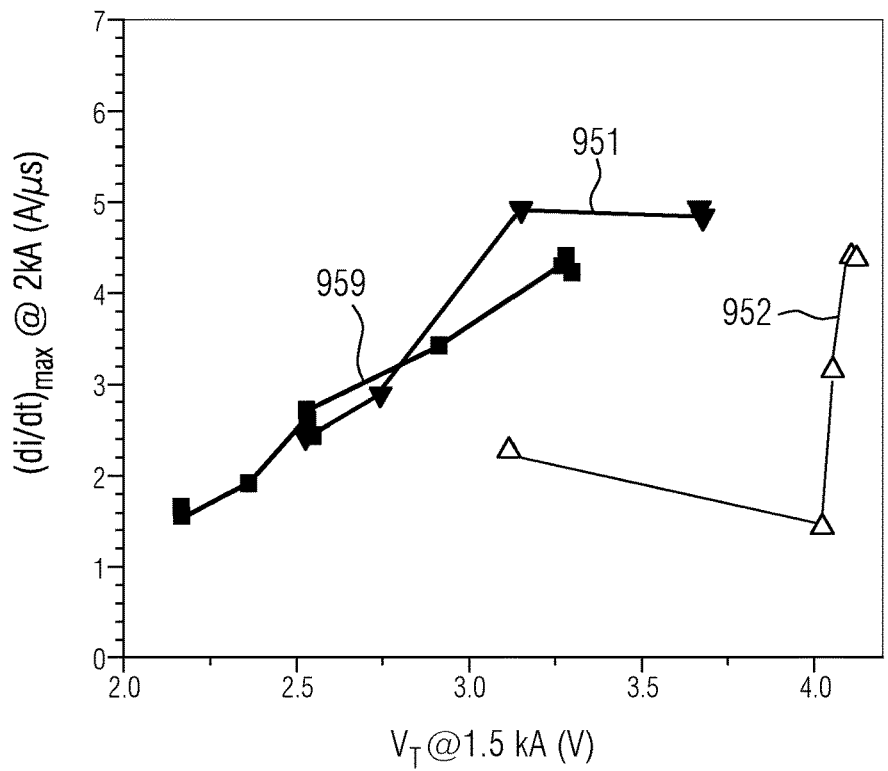
FIGS. 4C and 4D show measurement results of $(di/dt)_{max}$ at a current of 2 kA as a function of the ON state voltage VT at a current of 1.5 kA for samples with different proportions of the main surfaces covered by the emitter short regions and different irradiation doses.
Figure 4D:
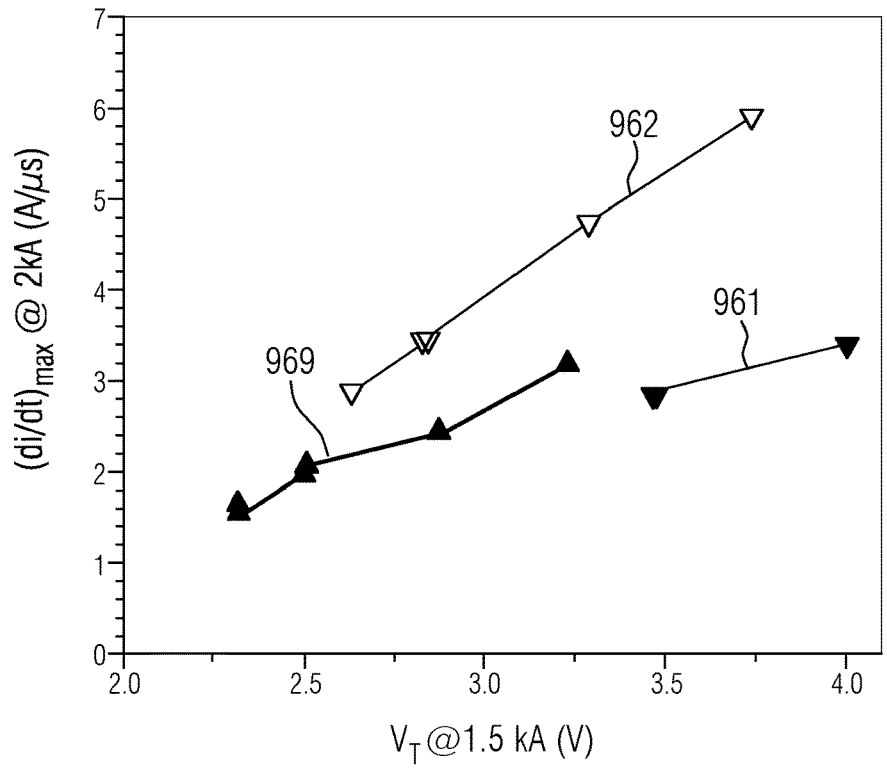

Measurement results for $(di/dt)_{max}$ at a current of 2 kA are illustrated in FIGS. 4C and 4D for the samples described in connection with FIGS. 4A and 4B, respectively.

The curves 951, 952 and 959 of FIG. 4C refer to the same samples as curves 931, 932 and 939 respectively. As illustrated by curves 951 and 952 a high $(di/dt)_{max}$ capability during commutation turn-off is obtained.

The curves 961, 962 and 969 of FIG. 4D refer to the same samples as curves 941, 942 and 949 respectively.

The curves in FIG. 4D illustrate that for smaller coverages and smaller differences an even better $(di/dt)_{max}$ capability may be obtained for the samples of curve 962 compared to sample 969 having the same coverage of 17% both for the cathode side and the anode side. For curve 961 with a coverage of 5% at the cathode side and 17% at the anode side the capability to turn off at high di/dt is reduced compared to the samples 962 having the inverse coverage.

Thus, the dynamic behavior of the bidirectional thyristor device 1 may differ for the first and second thyristor functional element.

Figure 4E:
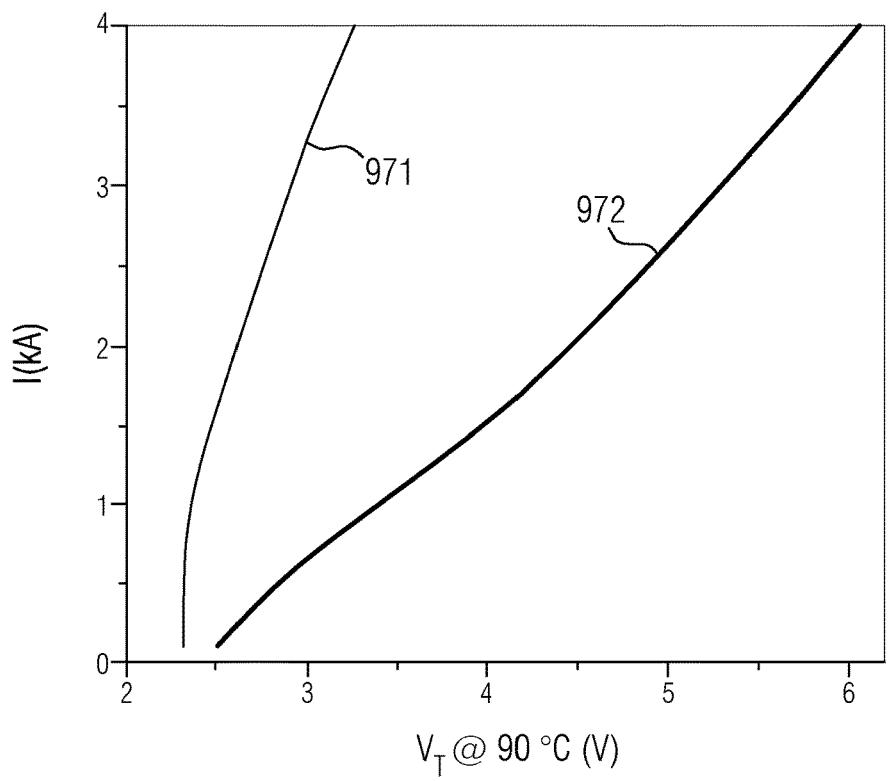
FIG. 4E shows the anode current as a function of the ON state voltage VT for two samples having different sizes of the emitter short regions.

FIG. 4E further illustrates that the size of the emitter short regions also has an impact on the anode current. The size of the emitter short regions for curve 971 is larger than that of those for curve 972. For the larger emitter short regions the same anode currents are obtained at a significantly lower on-state voltage VT.

In addition or alternatively an asymmetric behavior may also be obtained by different distances between the first and second emitter short regions 71, 72.

Figure 4F:
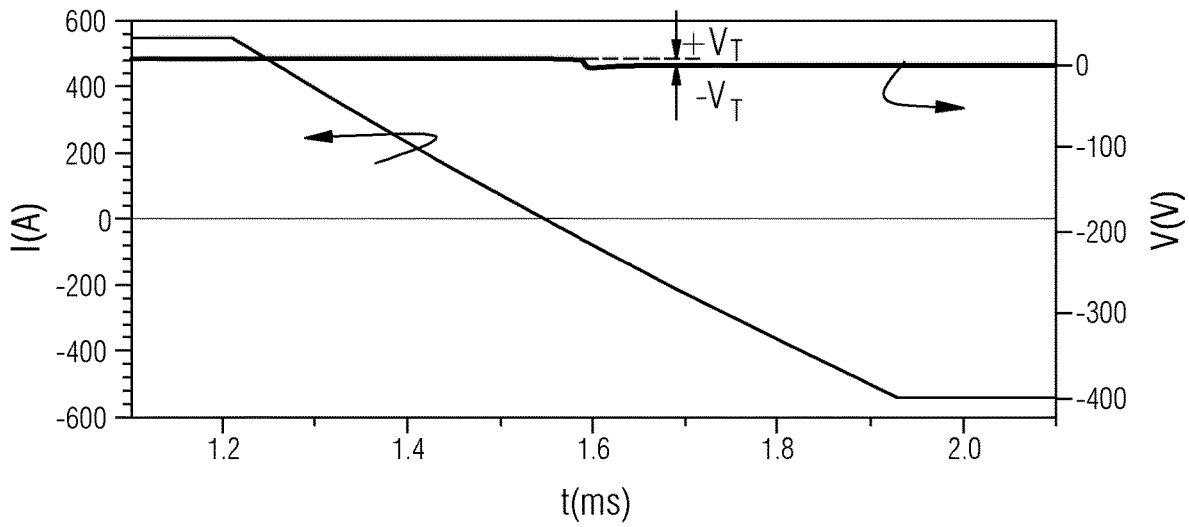
FIGS. 4F and 4G shows the turn-off behavior for the current I and the voltage V as a function of time for a sample having a large distance between emitter short regions (FIG. 4F) and for a sample having a small distance between emitter short regions (FIG. 4G)
Figure 4G:
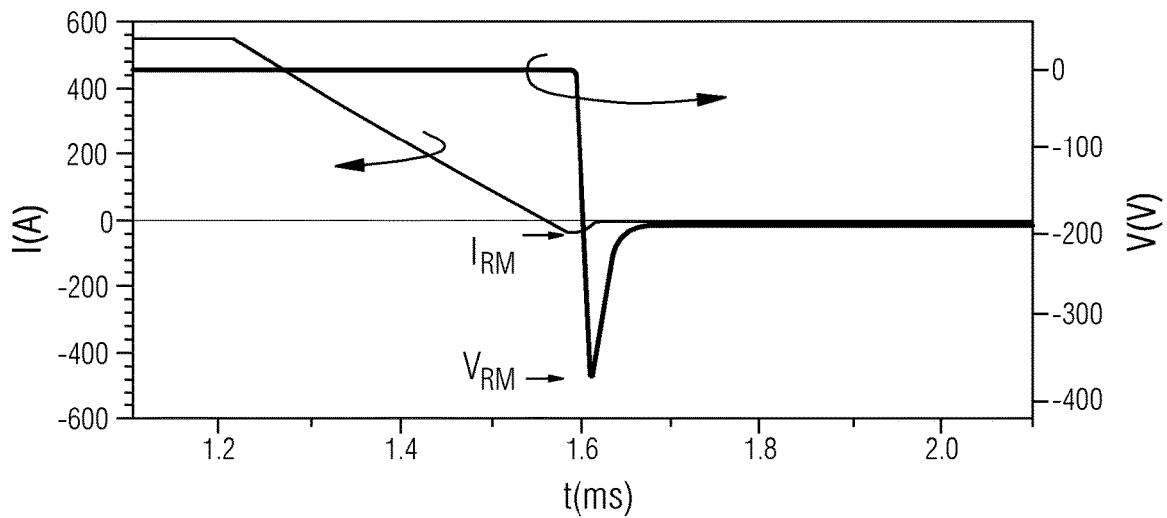

FIGS. 4F and 4G show the turn-off characteristics as a function of time for the current I and the voltage V for emitter short regions having a comparably large distance (FIG. 4F) and for closely spaced emitter short regions (FIG. 4G). In the case of FIG. 4F a voltage commutation does not result in a turn-off of the device. It is merely the current direction that changes.

For the sample shown in FIG. 4G in contrast, the device turns off and there is no significant current flow in negative direction.

Thus, the bidirectional thyristor device 1 may be configured such that the first thyristor functional element 11 and the second thyristor functional element 12 differ from one another with respect to the turn-off capability.

In the exemplary embodiment shown in FIG. 1A, the semiconductor body 2 is a full wafer with a beveled junction termination. However, the semiconductor body 2 may also be a part of a wafer, so that the bidirectional thyristor device 1 is a chip obtained by singulation of a processed wafer into individual devices. In this case, the bidirectional thyristor device 1 may comprise a planar p-n junction termination, for example using guard rings or a variation lateral doping (VLD). At the same time deep p-type sinks may be provided for reverse blocking capability. This also applies for the subsequent exemplary embodiments.

Figure 2:
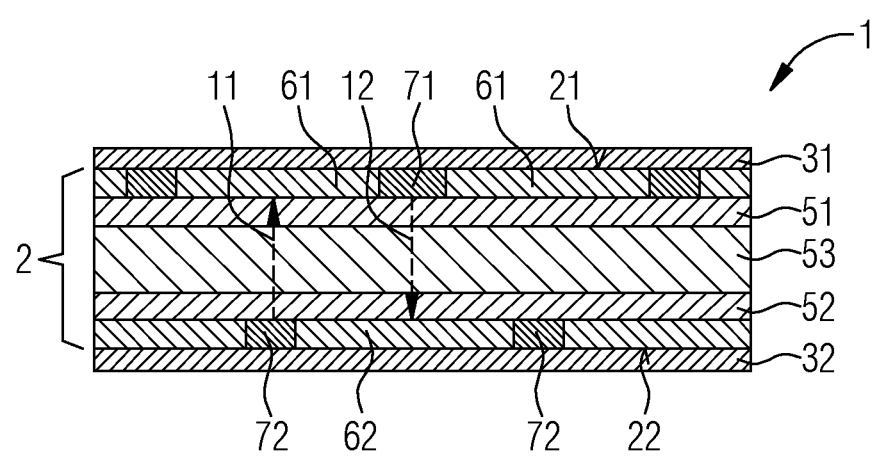
FIG. 2 shows an exemplary embodiment of the bidirectional thyristor device in a cross-sectional view.
Figure 3:
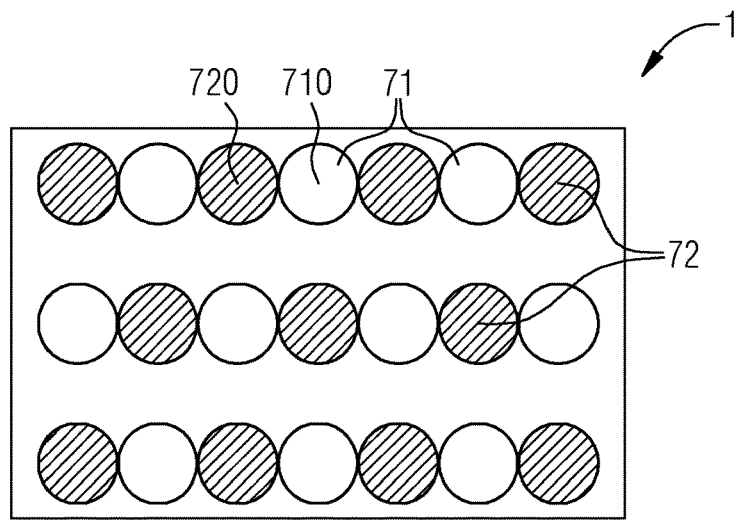
FIG. 3 shows an exemplary embodiment of a bidirectional thyristor device in a top view.

In the exemplary embodiments shown in FIGS. 2 and 3, the first emitter short regions 71 and the second emitter short regions 72 differ from one another with respect to their relative position when seen along the vertical direction.

As shown in FIG. 2, a first emitter short region 71 overlaps with a second emitter region 62. Thus, a length of a direct current path between a first emitter short region 71 and the closest second emitter region 62 is reduced compared to an arrangement where the first emitter short regions 71 and the second emitter short regions 72 have the same lateral position.

As shown in FIG. 3, the centers 710 of the first emitter short regions 71 may be arranged laterally beside the second emitter short regions 72. Likewise the centers 720 of the second emitter short regions 72 may be arranged laterally beside the first emitter short regions 71. The first and second emitter short regions 71, 72 may be arranged such that there is no overlap between them when seen along the vertical direction. The first emitter short regions 71 and the second emitter short regions 72 are arranged in an alternating manner along two directions. In the Figure an angle between the two directions is 90°. However, the angle may also differ from 90°. For example, an angle between the two directions is between 45° and 90° inclusive.

The exemplary embodiment of a bidirectional thyristor device 1 shown in FIGS. 5A and 5B essentially corresponds to that described in connection with FIGS. 1A to 1C.

In departure therefrom, the first main electrode 31 comprises a plurality of first segments 310 that are spaced apart from one another. At least some of the first segments 310, for instance at least 50%, or at least 90% or all of the first segments are completely surrounded by the first gate electrode 41 in a view onto the first main surface 21.

The first gate electrode 41 comprises a first grid structure 411 connected to a first gate electrode pad 410 (cf. FIG. 1A).

Each of the first segments 310 of the first main electrode 31 adjoin at least one first emitter region 61 of the second conductivity type and at least one first emitter short region 71 of the first conductivity type.

Figure 5A:
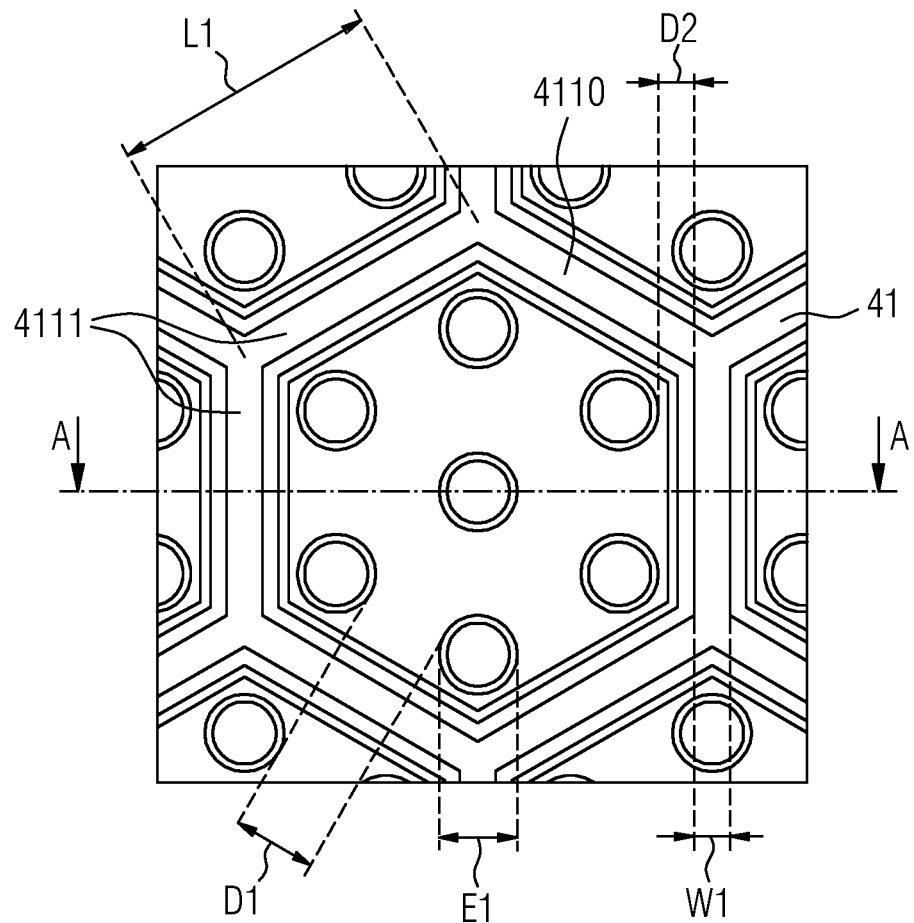
FIG. 5A shows a detail of an exemplary embodiment of a bidirectional thyristor device in top view.

In the exemplary embodiments shown in FIG. 5A the first grid structure 411 comprises a plurality of first cells 4110 of hexagonal shape thereby forming a honeycomb structure. However, other polygonal first cells may also apply for the first grid structure 411, for example tetragons or octagons.

Figure 5B:
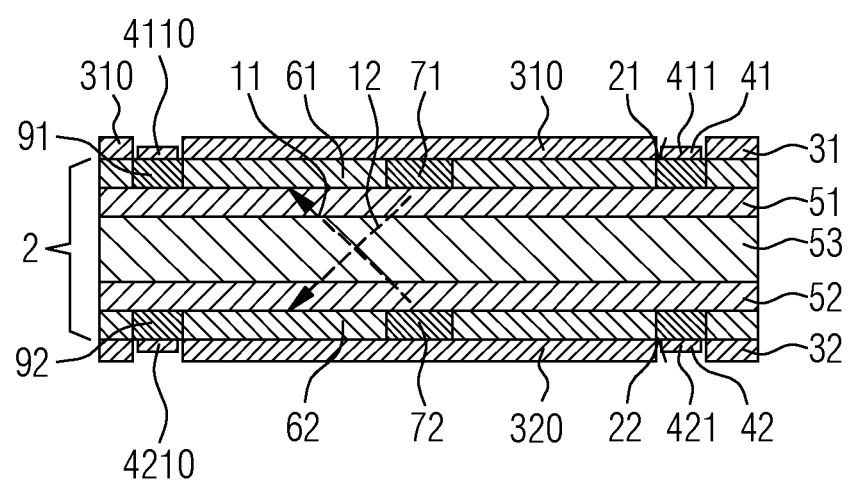
FIG. 5B shows a cross-sectional view of the bidirectional thyristor device of FIG. 5A.

As illustrated in the cross-sectional view of FIG. 5B, a second main electrode 32 and a second gate electrode 42 are arranged on a second main surface 22 of the semiconductor body. Like the first main electrode 31, the second main electrode 32 is split into a plurality of second segments 320. At least some of the second segments 320, for instance at least 50%, or at least 90% or all of the second segments 320 are completely surrounded by the second gate electrode 42 in a view onto the second main surface 22.

Each of the second segments 320 of the second main electrode 32 adjoins at least one second emitter region 62 of the second conductivity type and at least one second emitter short region 72 of the first conductivity type.

During operation of the bidirectional thyristor device 1 the first segments 310 of the first main electrode 31 may be electrically contacted to the same electrical potential, for instance by pressing a conductive plate or conductive wafer against the first main electrode 31. As shown in FIG. 5B, the thickness of the first gate electrode 41 within the first grid structure 411 is smaller than that of the first main electrode 31. Thus, the first grid structure 411 does not form an electrical contact to the plate or wafer. This applies to the second main electrode 32 as well.

The number of first cells 4110 may vary in wide limits depending on the intended application of the bidirectional thyristor device 1, for instance between 10 and 5000. For example, a device with a diameter of 100 mm may comprise several hundred first cells formed by the first grid structure 411.

A view onto the first main surface 21 may correspond to a view onto the second main surface 22. Therefore, views onto the second main surface 22 are not explicitly shown in the Figures. Features and parameters described in connection with the configuration on the first main surface 21, for example in connection with the first main electrode 31, the first gate electrode 41, the first grid structure 411, the first cells 4110, the first emitter region 61 and the first emitter short region 71 may likewise also apply for the corresponding element on the second main surface 22, for example for the second main electrode 32, the second gate electrode 42, the second grid structure 421, the second cells 4210, the second emitter region 62, and the second emitter short region 72, respectively. However, the parameters may also differ between the first main surface 21 and the second main surface 22, so that the bidirectional thyristor device is asymmetric.

A length L1 of one side 4111 of the first cells 4110 is between 500 µm and 5000 µm or between 900 µm and 3000 µm inclusive, for instance. The larger the length L1, the larger the contiguous area of the first segments 310 of the first main electrode 31.

A width W1 of one side of at least one of the first cells 4110 is between 100 µm and 2000 µm inclusive, for instance between 100 µm and 500 µm. The width of the sides together with their thickness define the cross-section of the first grid structure 411. The thickness of the first grid structure 411 is between 3 µm and 30 µm inclusive or between 5 µm and 12 µm inclusive, for instance. For instance, using these parameters the cross-section of the first grid structure 411 is big enough to avoid a significant voltage drop along the gate path from the first gate electrode pad to the outermost areas of the first grid structure 411.

The terms "length" and "width" refer to extensions in lateral direction. Thicknesses refer to the extent in vertical direction, i.e. perpendicular to the first main surface.

A maximum lateral extent E1 of the first emitter short regions 71 is between 50 µm and 1000 µm or between 100 µm and 500 µm inclusive, for instance.

An edge-to-edge distance D1 between two emitter short regions 71 within the same first cell is between 200 µm and 1000 µm inclusive or between 300 µm and 500 µm inclusive, for instance. The distance between the emitter short regions may be chosen appropriately to provide sufficiently high dV/dt.

An edge-to-edge distance D2 between the first grid structure 411 and the first emitter short region arranged closest to the first grid structure is between 50 µm and 400 µm or between 100 µm and 200 µm inclusive, for instance.

The above parameters may take into account design rules that do not apply for existing device concepts. For instance this is because the emitter short regions on the cathode side of one thyristor functional element act as anode regions for the antiparallel thyristor functional element at the same time.

Differing from FIG. 5A, for instance, first emitter short regions 71 arranged within one first cell may also have different values for the maximum lateral extent. For example the emitter short regions arranged closer to the edge of the first segments may be smaller than the maximum lateral extent of a first emitter short region arranged closer to the center of the respective first segment.

Alternatively or in addition, the first emitter short region 71 in the center may be replaced by several smaller first emitter short regions 71.

For example, first emitter short regions 71 arranged close to the edge of the first cell may have a diameter between 100 µm and 250 µm inclusive wherein first emitter short region 71 arranged closer to the center of the cell may have a diameter between 150 µm and 500 µm inclusive.

In the example shown in FIG. 5B, each first segment 310 overlaps with a plurality of first emitter short regions 71 wherein one first emitter short region 71 is arranged in the center of the first segment 310, whereas the further first emitter short regions 71 are arranged along the circumference of the first segments 310. However, a single emitter short region 71 may also be sufficient.

The described device structure provides a high di/dt capability due to the massively increased interface area between the gate electrodes and the main electrodes on the first and second main surfaces. Compared to conventional devices, short turn-on times after application of a gate current pulse may be obtained.

In conventional devices, the distance of a short region from a main electrode edge is kept low since it is inversely proportional to the dV/dt capability. This reduces the di/dt capability. In contrast, high values for dV/dt and di/dt may be obtained at the same time for the described bidirectional thyristor device 1, for example due to the massively increased gate-cathode area.

In the exemplary embodiment shown in FIG. 5B the size and the position of the first emitter short region 71 and the second emitter short regions 72 is the same for the first main surface 21 and the second main surface 22.

An asymmetric behavior of the bidirectional thyristor device 1 with respect to the first thyristor functional element 11 and the second thyristor functional element 12 may be obtained by configuring the semiconductor body 2 such that the turn-off times of the first and second thyristor functional element differ from one another.

This may be obtained by subjecting the regions of the semiconductor body 2 at a p-n junction between the first base layer 51 and the third base layer 53 to different irradiation doses than a region at a p-n junction between the second base layer 52 and the third base layer 53.

Figure 6:
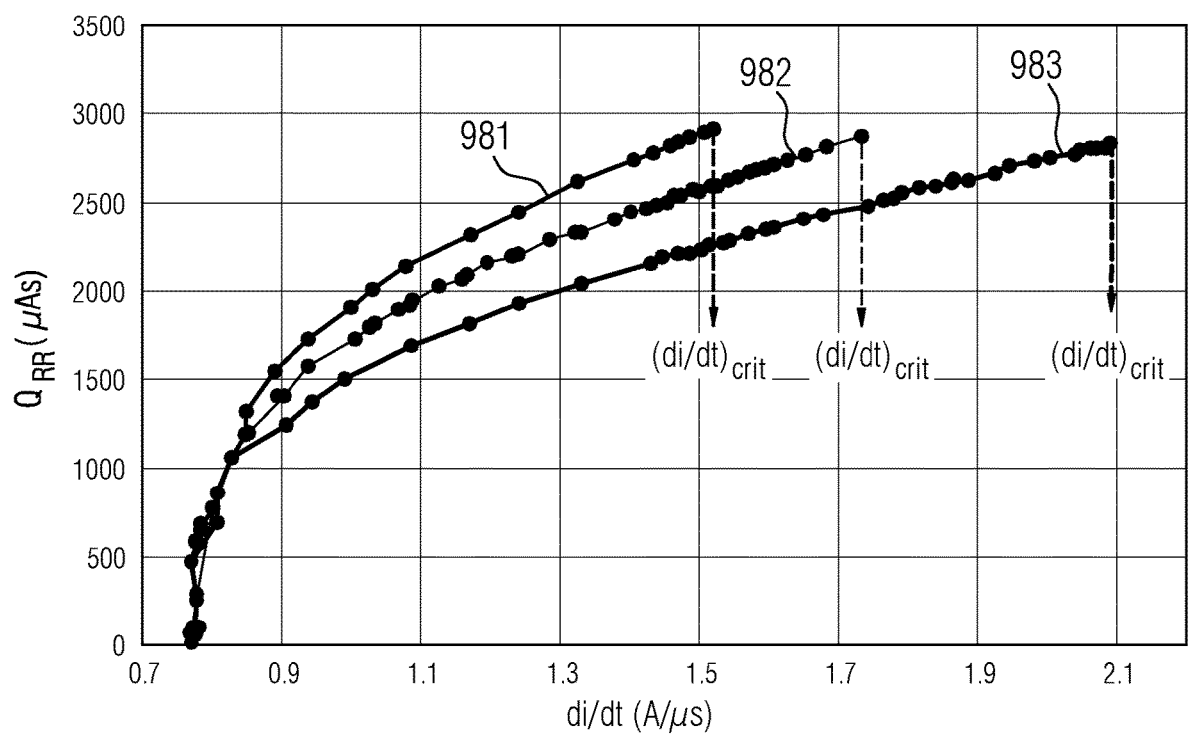
FIG. 6 shows measurement results for the charge recovery Qrr as a function of di/dt for samples treated with different irradiation doses.

The impact of the irradiation doses is illustrated in FIG. 6 showing curves 981, 982 and 983 belonging to three samples being treated with different irradiation doses. For each curve the value for $(di/dt)_{crit}$ representing the critical value for these samples is illustrated.

Above this critical value there is no turn-off during voltage commutation. Above this critical value the device operates without physical destruction and when di/dt gets back below the critical value $(di/dt)_{crit}$ in some of the next AC voltage waves, the turn-off capability recovers provided that the device was not overheated. FIG. 6 illustrates that the value for $(di/dt)_{crit}$ can be adjusted by the irradiation doses during the fabrication of the device. Consequently different values may be obtained for the first thyristor functional element 11 and the second thyristor functional element 12.

Devices irradiated with a lower irradiation dose further show a lower voltage drop in the ON-state reflected in lower electrical losses. If for example one of the thyristor functional elements operates in a circuit with a lower commutation di/dt due to a higher inductance in series, this thyristor functional element may require a lower irradiation dose and may be less lossy in the ON-state. The ON-state voltage VT drop also reflects in the magnitude of the surge current $I_{TSM}$. The lower the value for VT, the higher the magnitude of $I_{TSM}$.

Thus, one of thyristor functional elements may work as a crowbar failing at comparably low surge currents, whereas the other thyristor functional element acts as a bypass that is capable of withstanding high surge currents.

Different irradiation doses may also be applied for the devices described in connection with the previous exemplary embodiments.

Alternatively or in addition to different charge carrier recombination lifetimes, the bidirectional thyristor device of the exemplary embodiment shown in FIGS. 5A and 5B may be configured asymmetrically by changing the arrangement of the first emitter short region 71 and the second emitter short region 72 as described in the previous exemplary embodiments.

Furthermore, as in the previous exemplary embodiments, one of the first and second gate electrodes 41, 42 may be omitted.

Various combinations of the above ways to obtain an asymmetric behavior of the bidirectional thyristor device may be used to obtain different thyristor functional elements integrated in one semiconductor body.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 thyristor device
11 first thyristor functional element
12 second thyristor functional element
2 semiconductor body
21 first main surface
22 second main surface
31 first main electrode
310 first segments
32 second main electrode
320 second segments
41 first gate electrode
410 first gate electrode pad
411 first grid structure
4110 first cells
4111 side
42 second gate electrode
420 second gate electrode pad
421 second grid structure
4210 second cells
51 first base layer
52 second base layer
53 third base layer
61 first emitter region
62 second emitter region
71 first emitter short region
710 center of first emitter short region
72 second emitter short region
720 center of second emitter short region
8 amplifying gate structure
80 section
81 first partial region (first conductivity type)
82 second partial region (second conductivity type)
91 first gate contact region
92 second gate contact region
931, 932, 939 curve
941, 942, 949 curve
951, 952, 959 curve
961, 962, 969 curve
971, 972 curve
981, 982, 983 curve
L1 length of side
W1 width of side (covered by first/second gate electrode)
E1 maximum lateral extent of first emitter short region
E2 maximum lateral extent of second emitter short region
D1 edge-to-edge distance
D2 edge-to-edge distance

The invention claimed is:
1. A bidirectional thyristor device comprising
a semiconductor body extending in a vertical direction between a first main surface and a second main surface opposite the first main surface, and a first main electrode arranged on the first main surface, and a second main electrode arranged on the second main surface, wherein the semiconductor body comprises a first base layer of a first conductivity type, a second base layer of the first conductivity type, and a third base layer of a second conductivity type different than the first conductivity type arranged between the first base layer and the second base layer, the first main electrode acts as a cathode for a first thyristor functional element of the bidirectional thyristor device and as an anode for a second thyristor functional element of the bidirectional thyristor device, the first main electrode adjoins at least one first emitter region of the second conductivity type and a plurality of first emitter short regions of the first conductivity type, the second main electrode adjoins at least one second emitter region of the second conductivity type and a plurality of second emitter short regions of the first conductivity type, an arrangement of the plurality of first emitter short regions at the first main surface differs at least in regions from an arrangement of the plurality of second emitter short regions at the second main surface when seen along the vertical direction, so that the bidirectional thyristor device is configured asymmetrically with respect to the first thyristor functional element and the second thyristor functional element, and the bidirectional thyristor device comprises one or more of:
(i) a first gate electrode on the first main surface, wherein the first main electrode comprises a plurality of first segments that are spaced apart from one another, wherein at least some of the first segments are completely surrounded by the first gate electrode when seen along the vertical direction; and
(ii) a second gate electrode on the second main surface, wherein the second main electrode comprises a plurality of second segments that are spaced apart from one another, wherein at least some of the second segments are completely surrounded by the second gate electrode when seen along the vertical direction.

2. The bidirectional thyristor device according to claim 1, wherein a local charge carrier recombination lifetime at a p-n junction between the first base layer and the third base layer differs from a local charge carrier recombination lifetime at a p-n junction between the second base layer and the third base layer.

3. The bidirectional thyristor device according to claim 1, wherein at least one first emitter region overlaps with a second emitter short region when seen along the vertical direction.

4. The bidirectional thyristor device according to claim 1, wherein centers of at least some of the first emitter short regions are arranged beside the plurality of the second emitter short regions when seen along the vertical direction.

5. The bidirectional thyristor device according to claim 1, wherein for one of the plurality of first emitter short regions and an associated closest one of the plurality of second emitter short regions when seen along the vertical direction at least one of the following criteria applies:
(i) a maximum lateral extent of the first emitter short region differs from a maximum lateral extent of the associated closest second emitter short region; and
(ii) a center-to-center distance between the first emitter short region and its closest neighbor of the plurality of first emitter short regions differs from a center-to-center distance between the associated closest second emitter short region and its closest neighbor of the plurality second emitter short regions.

6. The bidirectional thyristor device according to claim 1, wherein a proportion of an area of the first main surface formed by the first emitter short regions differs from a proportion of an area of the second main surface formed by the second emitter short regions.

7. The bidirectional thyristor device according to claim 1, wherein the first thyristor functional element and the second functional element are configured to have different electrical ratings.

8. The bidirectional thyristor device according to claim 1, wherein on only one of the first main surface and the second main surface a gate electrode in form of the first gate electrode or the second gate electrode is provided.

9. The bidirectional thyristor device according to claim 8, wherein one of the first thyristor functional element and the second functional element is configured as a protection device against cosmic rays failure or external faults causing an overload during operation.

* * * * *